United States Patent [19]

Sue et al.

[11] Patent Number: 4,895,765
[45] Date of Patent: Jan. 23, 1990

[54] TITANIUM NITRIDE AND ZIRCONIUM NITRIDE COATING COMPOSITIONS, COATED ARTICLES AND METHODS OF MANUFACTURE

[75] Inventors: Jiinjen A. Sue, Indianapolis; Harden H. Troue, Plainfield, both of Ind.

[73] Assignee: Union Carbide Corporation, Danbury, Conn.

[21] Appl. No.: 905,510

[22] Filed: Sep. 10, 1986

Related U.S. Application Data

[63] Continuation-in-part of Ser. No. 781,459, Sep. 30, 1985, abandoned.

[51] Int. Cl.$^4$ ...................... B32B 15/18; C23C 15/00
[52] U.S. Cl. .............................. 428/627; 204/192.38; 423/411; 428/698
[58] Field of Search .................... 423/411; 204/192.38; 428/627, 698

[56] References Cited

U.S. PATENT DOCUMENTS

| | | |
|---|---|---|
| 3,625,848 | 12/1971 | Snaper .................................. 204/192 |
| 3,772,174 | 11/1973 | Spalvins ............................... 204/192 |
| 3,783,231 | 1/1974 | Sablev et al. ........................ 219/123 |
| 3,793,179 | 2/1974 | Sablev et al. ........................ 204/298 |
| 3,836,451 | 9/1974 | Snaper .................................. 204/298 |
| 3,922,214 | 11/1975 | Van Cakenberghe ............... 204/298 |
| 3,961,103 | 6/1976 | Aisenberg ............................. 427/39 |
| 4,022,872 | 5/1977 | Carson et al. ........................ 423/297 |
| 4,132,624 | 1/1979 | King et al. ............................ 204/298 |
| 4,169,913 | 10/1979 | Kobayashi et al. .................. 428/698 |
| 4,197,175 | 4/1980 | Moll et al. ........................ 204/192 R |
| 4,288,306 | 9/1981 | Kieferle et al. .................. 204/192 R |
| 4,401,719 | 8/1983 | Kobayashi et al. .................. 428/698 |
| 4,448,799 | 5/1984 | Bergman et al. ..................... 427/37 |
| 4,505,947 | 3/1985 | Vukanovic et al. .................. 427/34 |
| 4,512,867 | 4/1985 | Andreev et al. ..................... 204/298 |
| 4,525,415 | 6/1985 | Porat .................................... 428/216 |
| 4,565,747 | 1/1986 | Nakae et al. ........................ 428/698 |
| 4,673,477 | 6/1987 | Ramalingam et al. ......... 204/192.38 |
| 4,774,151 | 9/1988 | Cuomo et al. ....................... 428/698 |

FOREIGN PATENT DOCUMENTS 59299 5/1975 Japan .................................. 423/411

OTHER PUBLICATIONS

R. G. Duckworth et al., paper in *Third Solid Films*, 63 (1979), 289–297.

Primary Examiner—John Doll
Assistant Examiner—Wayne A. Langel
Attorney, Agent, or Firm—E. Lieberstein

[57] ABSTRACT

The present invention is directed to polycrystalline titanium nitride and zirconium nitride coating compositions and coated articles with a I(111)/I(200) x-ray diffraction intensity ratio of at least about 75 for the titanium nitride composition and at least about 15 for the zirconium nitride composition and to a method of forming a highly oriented polycrystalline titanium nitride or zirconium nitride coating composition with a high I(111)/I(200) x-ray diffraction intensity ratio. This invention also concerns polycrystalline titanium nitride and zirconium nitride coating compositions and coated articles of the type described with an interplanar spacing, $d_{111}$, of 2.460 Angstroms or less for TiN and an interplanar spacing, $d_{111}$, of 2.660 Angstroms or less for ZrN and to methods for producing same. The composition is deposited upon a substrate in an evacuated chamber from a titanium or zirconium cathode source surrounded by an elongated member which overhangs the cathode to form a cathode chamber. Nitrogen gas is passed through the cathode chamber into the vacuum chamber.

29 Claims, 12 Drawing Sheets

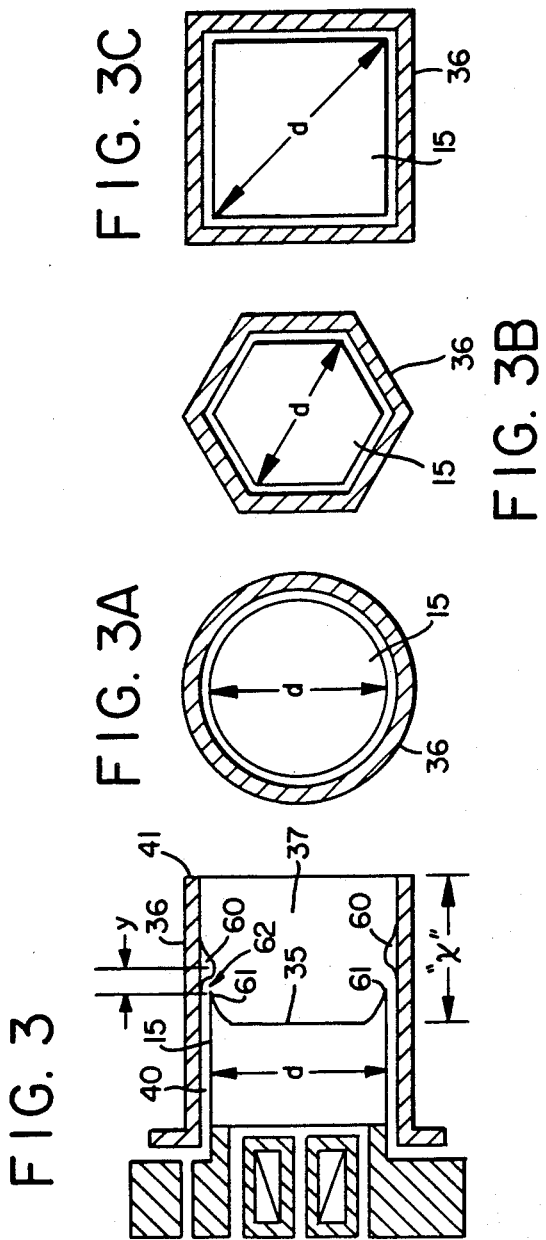

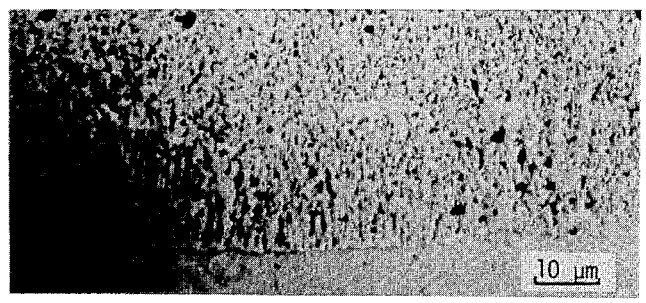
F I G. 4A
F I G. 4B
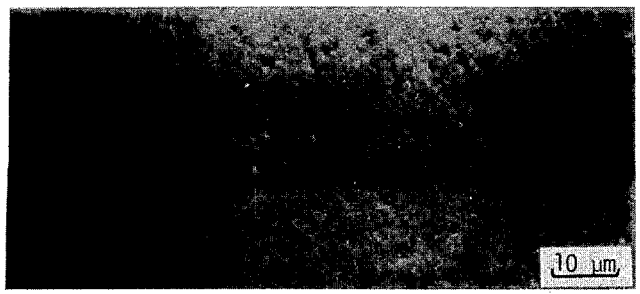
F I G. 4C

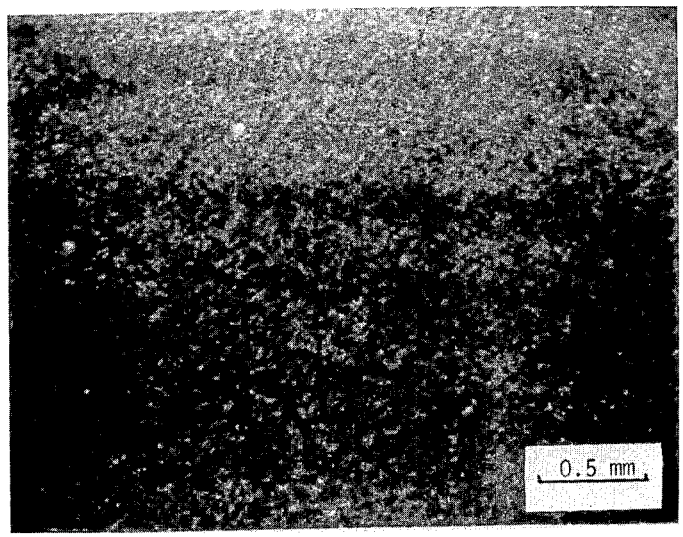
FIG. IIA
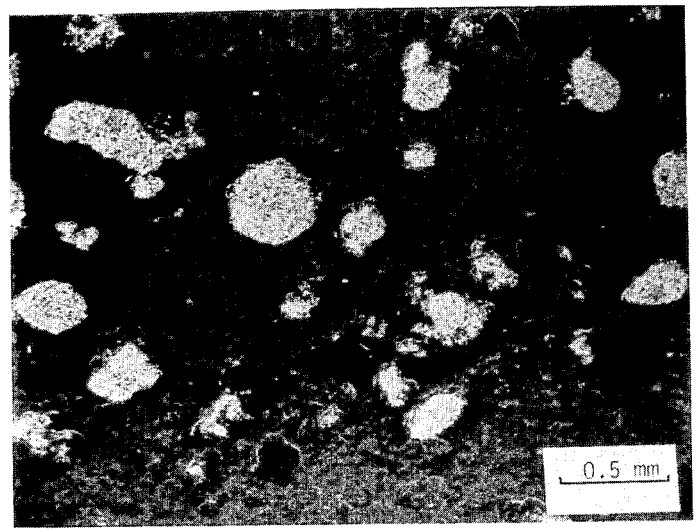
FIG. IIB

TITANIUM NITRIDE AND ZIRCONIUM NITRIDE COATING COMPOSITIONS, COATED ARTICLES AND METHODS OF MANUFACTURE

This application is a continuation-in-part application of application Ser. No. 781,459, filed Sep. 30, 1985 abandoned.

FIELD OF INVENTION

This invention relates to erosion resistant titanium nitride and zirconium nitride coating compositions, coated articles and methods of forming unique polycrystalline titanium nitride coatings, or zirconium nitride coatings, having highly oriented crystallographic structures and/or controlled residual stress levels which enhance erosion resistant properties.

BACKGROUND OF INVENTION

Titanium nitride is a titanium compound formed by reacting titanium metal with nitrogen. Zirconium nitride is formed by reacting zirconium metal with nitrogen. A coating of titanium nitride or zirconium nitride may be formed directly upon the surface of an object by physical vapor or chemical vapor deposition processes in a partially evacuated atmosphere. Physical vapor deposition embodies a number of deposition processes including reactive sputtering, D. C. sputtering, ion plating and arc evaporation deposition processes. The physical vapor deposition arc process uses a high current density electric arc to deposit a coating upon a substrate through the evaporation of source material. Chemical vapor deposition processes occur at relatively high temperature and are limited to substrate materials with mechanical and physical properties that are not adversely affected by process temperatures. Physical vapor deposition processes occur at much lower temperatures and can form a coating over a wide range of substrate materials such as carbide cermets, stainless steels, tool steels, superalloys and titanium alloys.

Titanium nitride has been successfully used as a protective coating for cutting and forming tools in the manufacturing industries and is presently recognized for its relatively high wear resistant and low frictional wear properties.

The titanium nitride crystal (TiN) and the zirconium nitride crystal (ZrN) have a NaCl type structure, consisting of two interpenetrating face-centered cubic lattices. X-ray diffraction techniques are commonly used to identify crystal structure and to determine crystallographic orientation and interplanar spacing. The intensity of x-ray diffraction from different planes of the crystal lattice is a measure of the crystallographic orientation. The interplanar spacing is a measure of the compressive stress level of the material. It is well recognized that titanium nitride and zirconium nitride, produced with physical vapor deposition and chemical vapor deposition processes, exhibit a preferred crystallographic orientation in the (111), (100) or (110) diffraction plane. Accordingly, the x-ray diffraction intensities for TiN and ZrN are commonly measured from these planes.

Although it is known that the x-ray diffraction intensity from polycrystalline titanium nitride and polycrystalline zirconium nitride may vary with the parameters of the physical vapor deposition arc process such as, for example, the configuration of the Ti or Zr cathode, chamber pressure, bias voltage, arc current, substrate standoff and temperature and the flow rate of gas through the chamber, only limited studies have been made relating to the effect on the physical properties of polycrystalline TiN or ZrN of variations in x-ray diffraction intensity. Prior art measurements have been made on flank wear of polycrystalline TiN. These measurements indicate that no significant improvement in the flank wear for polycrystalline TiN is realized when the x-ray diffraction intensity ratio I (111)I(200) is greater than 6. It has been observed in accordance with the present invention however that the erosion resistance of polycrystalline TiN and polycrystalline ZrN continue to increase as the x-ray diffraction intensity ratio I(111)/I(200) increases. Accordingly, the erosion resistance of polycrystalline TiN and polycrystalline ZrN can be controlled by controlling the x-ray diffraction intensity ratio I(111)/I(200).

It has been further discovered in accordance with the present invention that there is a minimum x-ray diffraction intensity ratio of I (111I)/I(200) for titanium nitride, measured as a ratio between the diffraction intensity from the (111) plane relative to the diffraction intensity from the (200) plane, necessary to provide a sound dense microstructure with superior erosion resistant characteristics. At an I (111)/I(200) x-ray diffraction intensity ratio of at least about 75 the TiN coating exhibits erosion resistance of a TiN coating produced by any of the prior art physical or chemical vapor deposition processes. At an I(111)/I(200) ratio of at least about 15, the ZrN coating exhibits erosion resistance which is substantially greater than the erosion resistance of a ZrN coating produced by any of the prior art physical or chemical vapor deposition processes. Moreover, the I (111)/I (200) x-ray diffraction intensity ratios of the titanium nitride crystal and the zirconium nitride crystal can be varied in accordance with the practice of the present invention to tailor the microstructure and erosion resistance of the coating for a particular application.

It has been observed also in accordance with this invention that the high angle (e.g. 90°) impact erosion resistance of polycrystalline TiN and ZrN coatings and character of the erosion mechanism are a function of the residual coating stress as determined by the interplanar spacing, $d_{111}$, of the (111) diffraction planes. Accordingly, the high angle impact erosion resistance and mechanism of the polycrystalline TiN or ZrN can be controlled by controlling the interplanar spacing of the (111) planes. It has been further discovered pursuant to this invention that there is a maximum interplanar spacing, $d_{111}$, for each of the polycrystalline TiN and ZrN coatings, below which uniformly eroded surfaces and lower erosion rates have been observed to result from high angle (90°) impact erosion and above which relatively large erosion pits due to intracoating spalling and relatively higher erosion rates have been observed in the eroded surfaces of the coatings when subjected to high angle (90°) impact erosion. At or below an interplanar spacing, $d_{111}$, of about 2.460 Angstroms for TiN coatings, and at or below an interplanar spacing, $d_{111}$, of about 2.660 Angstroms for ZrN coatings, uniformly eroded surfaces and relatively lower erosion rates have been observed after being subjected to high angle (90°) impact erosion whereas above these approximate values intracoating spalling and relatively higher rates of erosion have been experienced.

SUMMARY OF THE INVENTION

The present invention provides polycrystalline titanium nitride and polycrystalline zirconium nitride coating compositions having highly oriented crystallographic structures with enhanced erosion resistant properties and methods for forming polycrystalline titanium nitride and polycrystalline zirconium nitride coating compositions with high I(111)/I(200) x-ray diffraction intensity ratios. This invention also provides methods of forming polycrystalline titanium nitride and polycrystalline zirconium nitride coating compositions having interplanar spacings, $d_{111}$, less than a specified value and further enhanced erosion resistant properties.

The polycrystalline titanium nitride and polycrystalline zirconium nitride coating compositions of the present invention have highly oriented crystalline structures with I(111)I(200) x-ray diffraction intensity ratios of preferably at least about 75 for the TiN coatings and at least about 15 for the ZrN coatings, levels not heretofore obtainable by prior art teachings. The method for forming such compounds upon a substrate comprises the steps of:
 mounting a titanium or zirconium cathode having an evaporable end surface in a vacuum chamber spaced apart from an anode and the substrate with the chamber being evacuated to a predetermined pressure;
 generating an electric arc between the evaporable end surface of the titanium or zirconium cathode and the anode to form a plasma;
 surrounding the cathode body with an elongated member having an open end extending a predetermined distance "x" of above zero beyond the evaporable end surface to form a cathode chamber, the elongated member being positioned between and spaced from the cathode and the anode;
 directing a flow of nitrogen gas through the cathode chamber and into the vacuum chamber such that the nitrogen gas envelops the electric arc over at least the distance "x" before entering the vacuum chamber; and
 withdrawing the nitrogen gas from the vacuum chamber to maintain a predetermined pressure within the vacuum chamber.

BRIEF DESCRIPTION OF THE DRAWINGS

The present invention will hereinafter be best understood by making reference to the accompanying drawings, wherein:

FIG. 3 is an enlargement of the cathode assembly of FIG. 2 after operating for an extended period of time with the end of the titanium or zirconium cathode shown partially evaporated and with a buildup of evaporated material shown on the inside wall surface of the elongated member;

FIGS. 3A, 3B, and 3C are respective end views of alternate geometries for the titanium or zirconium cathode and the elongated member;

FIGS. 4A, 4B, and 4C show a comparison of the cross-sectional microstructures of titanium nitride coatings with different x-ray diffraction intensity ratios I(111)/I(200) of 3, 75 and 220 respectively.

FIG. 11A is a SEM photomicrograph of the surface of a high angle impact eroded TiN coating having a $d_{111}$ of 2.460 Angstroms and an I(111)/I(200) of 1700.

FIG. 11B is a SEM photomicrograph of the surface of a high angle impact eroded TiN coating having a $d_{111}$ of 2.463 Angstroms and an I(111)/I(200) of 1700.

DESCRIPTION OF THE PREFERRED EMBODIMENT

Figure 1:
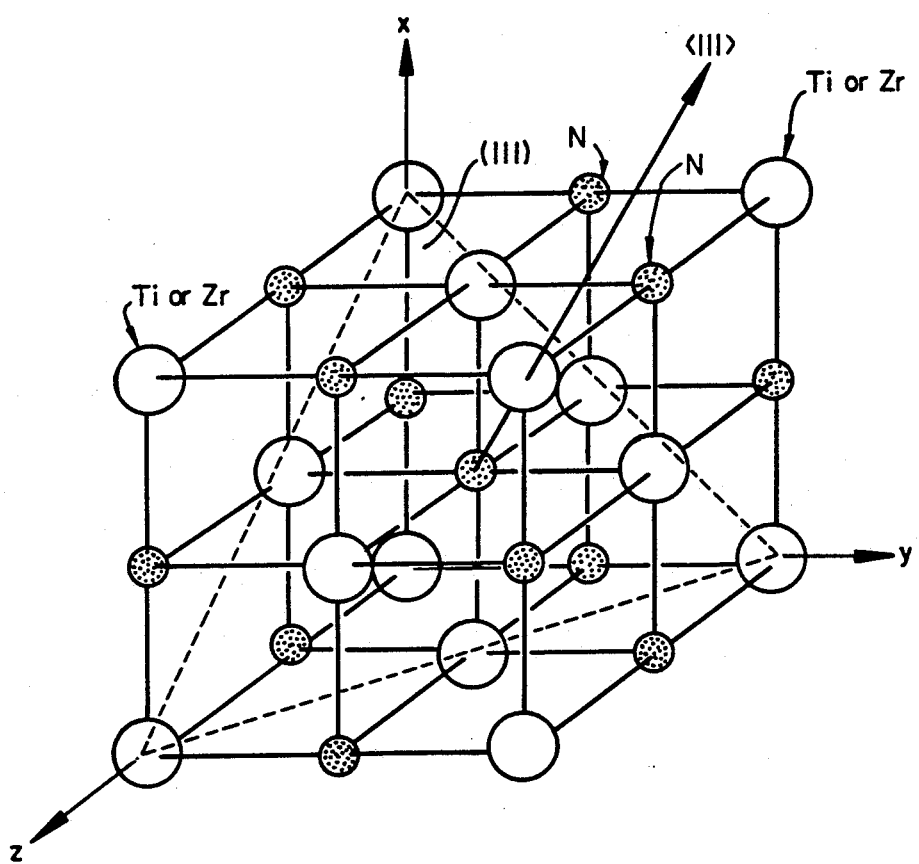
FIG. 1 is a diagrammatic illustration of the structure of a titanium nitride or zirconium nitride crystal showing the orientation of planes through the crystal lattice from which the x-ray diffraction intensity is measured.

A single TiN or ZrN crystal is shown in FIG. 1 consisting of two interpenetrating face centered cubic lattices, one of Ti or Zr atoms and the other of N atoms. The N atoms are positioned between the Ti or Zr atoms. The dotted lines making intercepts of one cell length distance on the X, Y and Z axes, respectively, i.e., (1, 1, 1), lie in a plane which represents the (111) plane of orientation for this crystal. The normal to the (111) plane is given the reference designation <111>. The (200) plane intersects the X axis at two units of cell length distance, i.e., (2, 0, 0). The normal to the (200) plane (not shown) is given the reference designation <200>. X-ray diffraction for this crystal is measured by recording the intensity of a reflected x-ray beam at predetermined angles of reflection. The predetermined angles of reflection which correspond to the (111) and (200) planes are well known to those skilled in the art of x-ray diffractometry.

Since instrument conditions are subject to change and the intensity of reflect ion from the (111) plane may be susceptible to variation in coating thickness, a measurement of the absolute value of the intensity from the (111) plane has relatively limited significance, unless a standard value is established. To provide a meaningful standard, the TiN and ZrN coating measurements were normalized in accordance with the present invention by measuring the ratio between the diffraction intensity from the (111) plane (hereafter I(111)) and the diffraction intensity from the (200) plane (hereinafter I(200)). A higher ratio value of I(111)/I(200) indicates a higher volume fraction of TiN or ZrN crystallites oriented in the (111) plane. The value of I(111)/I(200) represents an overall intrinsic property characteristic of the coating.

Figure 2:
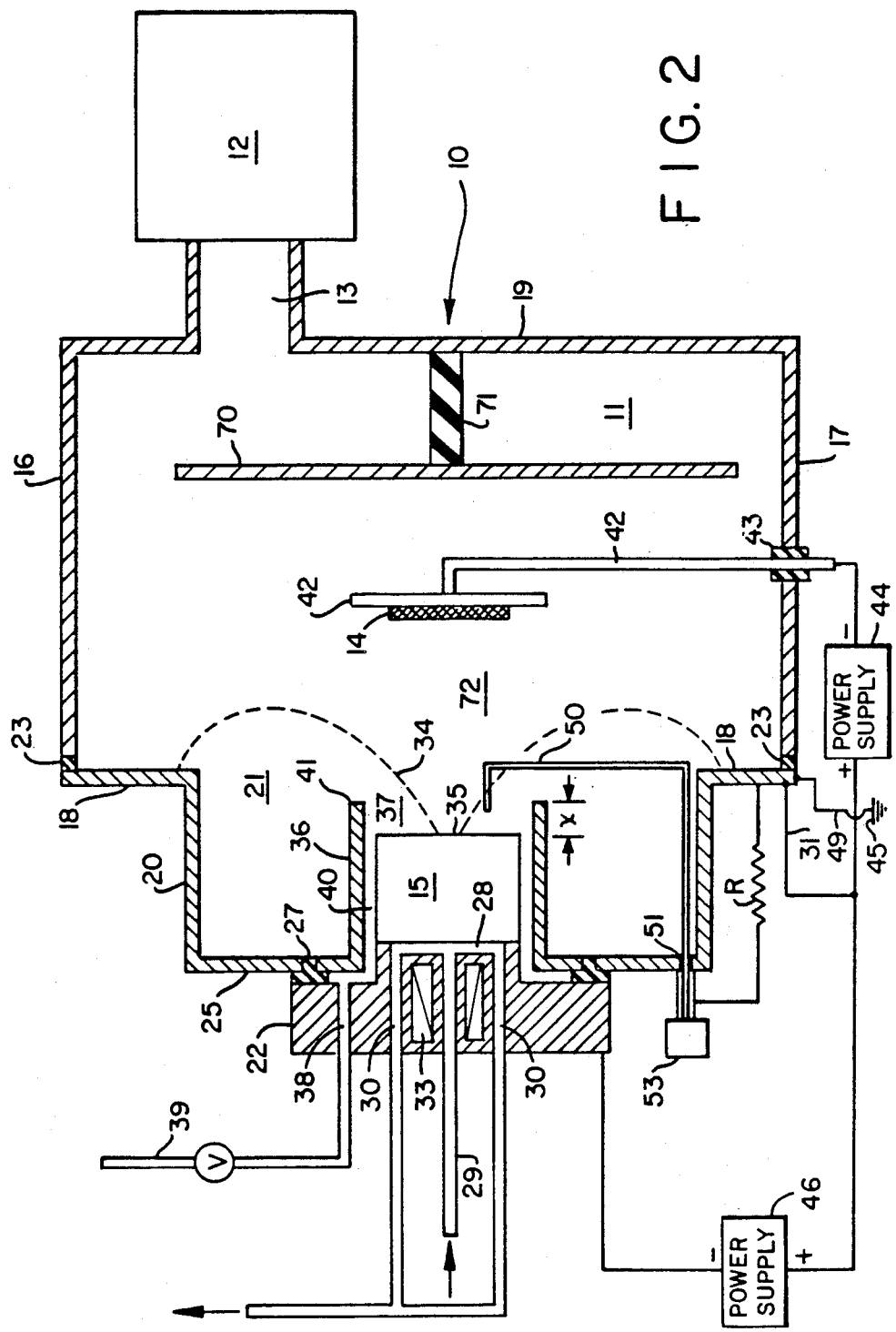
FIG. 2 is a side view elevation partly in cross-section and partly schematic of the apparatus for practicing the method of the present invention.

The apparatus for practicing the method of the present invention is shown in FIG. 2 comprising a shell 10 having a vacuum chamber 11 which is evacuated to a desired operating pressure of generally between $10^{-1}$ to $5 \times 10^{-4}$ torr and preferably between $5 \times 10^{-2}$ and $5 \times 10^{-3}$ torr by a conventional vacuum pumping system 12 communicating with the vacuum chamber 11 through an open port 13.

The vacuum chamber 11 may have any desired geometry and be of any desired size to accommodate one or more objects 14 to be coated with source material provided by evaporating one or more solid titanium or zirconium cathodes 15 in accordance with the practice of the present invention. For illustrative purposes, the shell 10 is shown having a generally rectangular body which, in cross-section, has an upper wall 16, a lower wall 17, and side walls 18 and 19, respectively. The shell 10 can include an additional section 20 which projects an arbitrary distance from the side wall 18. The side wall 18 has an opening 21 through which the titanium or zirconium cathode 15 communicates with the vacuum chamber 11.

The titanium or zirconium cathode 15 is attached to a cathode support assembly 22. The cathode support assembly 22 is mounted on a flange 25 through an insulator 27. The mounting flange 25 is connected to section 20 of the shell 10. The support block 22 has a relatively small cavity 28 connected to an inlet passage 29 and to exit passages 30. A coolant such as water is circulated through the cavity 28 from a source (not shown). The coolant flows from the source through the inlet passage 29 into the cavity 28 and returns to the source through the exit passages 30. A DC magnet 33 is disposed within the support block 22 and serves to diffuse the point of attachment of an electric arc 34 over the arc evaporation surface 35 of the cathode 15.

A hollow elongated member 36 surrounds and is spaced from the titanium or zirconium cathode 15 to form a relatively narrow space 40. The elongated member 36 is attached to the mounting flange 25 through the insulator 27. The geometry of the member 36 and open end 41 preferably substantially conforms to the geometry and dimension of the titanium or zirconium cathode 15 as shown in FIGS. 3A, 3B and 3C, respectively. The elongated member 36 should be substantially uniform in cross sectional dimension over its length. This assures that the open end 41 does not restrict the plasma flow as it exits member 36. Accordingly, if a cylindrical or disk shaped titanium or zirconium cathode is used, the member 36 should preferably be tubular in shape with the narrow space 40 being annular in cross-section. For a 6.35 cm diameter cathode the thickness of the annular space 40 can range from about 0.08 cm to about 0.24 cm. An inlet opening 38 in the support block 22 directly communicates with the narrow space 40 and with an input nitrogen gas supply line 39. Nitrogen gas is fed through the nitrogen gas supply line 39 from a source of nitrogen gas (not shown) into the narrow space 40 from whence the gas is directed through the cathode chamber 37 into the vacuum chamber 11. A valve V is used to control the flow of nitrogen gas through the supply line 39.

The elongated member 36 projects a predetermined distance "x" beyond the cathode evaporable end surface 35 to form a cathode chamber 37. The extension "x" between the open end 41 of the member 36 and the evaporable end surface 35 must be above zero and up to a maximum of, for example, about 13 cm in length for a 6.35 cm diameter cathode 15. The distance "x" is measured from the cathode evaporable end surface 35 as shown in FIG. 3 to the open end 41 of the elongated member 36. The preferred minimum distance "x" is at least about one centimeter and the preferred range for "x" is between 2 to 6 cm for a 6.35 cm diameter cathode. Similar aspect ratios of "x", herein defined as x/d where "d" is the major dimension of the cathode evaporable end surface 35, must be maintained for all cathode geometries such as those shown in FIGS. 3A, 3B and 3C, respectively. The aspect ratio must be above zero and up to a maximum of about 2.0. The preferred minimum aspect ratio is at least about 0.07 and the preferred range of the aspect ratio is between 0.3 and 1.0. The critical requirement and importance of recessing the cathode 15 within the member 36 to form cathode chamber 37 will be discussed at greater length later in the specification. The elongated member 36 may preferably be composed of any material that does not interfere with the function of magnet 33 in diffusing the attachment of electric arc 34 over the arc evaporation surface 35 and can comprise any nonmagnetic material suitable for high temperature vacuum service, e.g., nonmagnetic stainless steel.

The object 14 is mounted upon a support plate 42 located within the vacuum chamber 11 and spaced apart from the evaporable end surface 35 of the titanium or zirconium cathode 15. The type of structure used to support or suspend the object 14 within the vacuum chamber 11 depends upon the size, configuration and weight of the object. For simplicity, the object 14 is shown having a rectangular geometry with a flat surface facing the cathode evaporation end surface 35. It should be understood that the object 14 may have any configuration and may be supported in any fashion. The object 14 may also be of any suitable composition capable of withstanding the high temperature, vacuum conditions existing in the chamber 11 and can be made of such materials as refractory metals, superalloys, stainless steels, ceramic composites and titanium alloys. The support plate 42 should, however, be composed of a conductive material and is connected to a metal rod 42 which extends through an insulated high voltage feed-through port 43 in the lower wall 17 of the shell 10. The metal rod 42 is connected to the negative terminal of a bias power supply 44 located external of the shell 10 with the positive terminal of the bias power supply 44 connected to the side wall 18 through the electrical lead 31.

The vacuum chamber 11 further can include an electrically insulated surface 70 located opposite the cathode evaporable end surface 35 with the object 14 and support plate 42 positioned therebetween. The electrically insulated surface 70 can be itself comprised of an insulator material or can be comprised of a conductive material which is insulated from the chamber 10 by insulator 71 shown. This electrically insulated surface 70 serves to substantially confine the plasma to the chamber volume 72 between surface 70 and cathode evaporable end surface 35 wherein the object 14 is located without surface 70 attracting ions or electrons from the plasma and further serves to prevent interaction between plasmas when multiple evaporators are accommodated in chamber 11.

Arc current is supplied from a main power supply 46 located external of the shell 10. The main power supply 46 has its negative terminal connected to the cathode support block 22 and its positive terminal connected to the side wall 18. The electric arc 34 is formed between the titanium or zirconium cathode 15 and the side wall 18 of the shell 10. The side wall 18 represents the anode and can be connected to ground potential 45 through an electrical lead 49. Alternatively, the anode may be formed from another conductive member (not shown) mounted adjacent to but electrically separated from the side wall. The geometry of such anode would not be critical. In the latter case, the arc conduit can be electrically isolated from the shell 10. It is also obvious that the side wall 18 can be electrically insulated from the other walls of the shell 10 by using insulating separators such as those shown at 23. It is also obvious that the anode side wall 18 can be free-floating with the ground at 45 removed and the shell wall 16, 17 and 19 grounded.

Any conventional arc starting procedure may be used including physically contacting the titanium or zirconium cathode end surface 35 with a wire electrode 50. The wire electrode 50 is electrically connected to anode side wall 18 or a separate anode (not shown) through a high resistance R. In addition, the wire electrode 50 is connected to a plunger assembly 53 through an insulated sleeve 51 in the mounting flange 25. The plunger assembly 53 moves the wire electrode into physical contact with the cathode end surface 35 and then retracts it. A conventional plunger assembly for performing this operation is taught and described in U.S. Pat. No. 4,448,799. However, any mechanism capable of moving the starting wire electrode 50 into contact with the cathode 15 and withdrawing it may be used to practice the present invention. Alternatively, an arc may be started by other conventional methods including transferred arc starting and spark starting using a spark plug.

In touch starting, once contact is made between the starting wire electrode 50 and the cathode 15, current flows from the main power supply 46 through the cathode 15 and wire electrode 50 to anode side wall 18. Retraction of the wire electrode 50 breaks contact with the cathode 15 to form an electric arc. The high resistance R causes the arc to transfer to the anode side wall 18 which is a less resistive path than the path to the wire electrode 50.

The plasma produced by the high current density arc includes materials, such as atoms, molecules, ionized atoms and ionized molecules of the titanium or zirconium cathode evaporation surface 35 and ionized species of nitrogen gas. Biasing the object 14 negatively with respect to the anode 18 or to both the anode 18 and cathode 15 influences the smoothness, uniformity and surface morphology of the coating. The bias power supply should be adjusted to a bias potential to optimize the coating operation. For a TiN, or ZrN, coating a bias potential for power supply 44 of between 50 and 400 volts is acceptable with a bias potential between 100 and 200 volts preferred for TiN and a bias potential between 50 and 250 volts preferred for ZrN.

Nitrogen gas is fed through the space 40 into the cathode chamber 37 representing the volume of space between the cathode evaporation surface 35 and the open end 41 of the elongated member 36. The nitrogen gas envelops the high current density arc in the cathode chamber 37 over the distance "x" resulting in an increase of plasma pressure and temperature. The plasma extends from the cathode evaporation end surface 35 through the relatively high pressure region in the cathode chamber 37 and exits through the open end 41 of the elongated member 36 toward the relatively lower pressure region in the vacuum chamber 11, or chamber volume 72, where the negatively biased substrate is located. An additional benefit of feeding nitrogen gas through the narrow space 40 into cathode chamber 37 is that the nitrogen gas in space 40 serves an insulator to prevent arcing from the cathode 15 to the member 36.

During operation, some of the evaporated titanium or zirconium cathode material will deposit on the inside surface of the member 36 to form a deposit 60. This is diagrammatically illustrated in FIG. 3. The nitrogen gas injected from narrow space 40 prevents the deposit 60 from accumulating and bridging over to the cathode 15. Instead, as the operation proceeds, a convergent nozzle 62 is formed between the deposit 60 and the outer edge 61 of the cathode 15. The outer edge 61 becomes more pronounced as the evaporable end surface 35 is consumed. The nitrogen gas flows through this convergent nozzle 62 across the face 35 of cathode 15 and into the plasma contained in cathode chamber 37. After prolonged operation, both the evaporable end surface 35 and the outer edge 61 recede enlarging the distance "x". The enlargement in the distance "x" is less than about 0.35 cm during normal operation and is therefore insignificant to the method of the invention. The deposit 60 apparently continues to accumulate as the edge 61 recedes so as to maintain the dimension "y" of the convergent nozzle 62 substantially constant by shifting its position in conjunction with the eroded outer edge 61. The dimension "y" is maintained substantially constant at a value greater than zero and less than about 0.4 cm over the range of operating parameters. Control over the dimension "y" results from the method of introducing nitrogen gas into the cathode chamber 37. Accordingly, the operation of the convergent nozzle 62 is a self-correcting phenomenon which assures that the nitrogen gas continues to be directed across the face 35 of the cathode 15 as it flows into the cathode chamber 37 from narrow space 40. In accordance with the present invention, the nitrogen gas must always first enter the cathode chamber 37 before the nitrogen gas enters the vacuum chamber 11, or chamber volume 72.

The microstructure of the coating varies with the magnitude of the intensity ratio of I(111)/I(200). FIGS. 4A, 4B and 4C show a comparison of TiN coating structures with I(111)/I(200) ratios of 3, 75 and 220 respectively. The size and amount of porosity and Ti inclusions decrease with increasing values of I(111)/I(200). A sound and dense TiN coating structure appears to be dependent upon the ratio value of I(111)/I(200), with a relatively dense structure formed at about 75.

The following Table I lists the ratio values of I(111)/I(200) for TiN and ZrN both as a powder and based upon reported values for TiN coatings formed in accordance with various prior art processes and in accordance with the subject invention.

TABLE I

| Process | Ratio of I (111)/I (200) |
|---|---|
| TiN | |
| Powder | 0.77 |
| Chemical Vapor Deposition | 0.39 to 15 |
| Ion Plating | 0.25 and 4.8 |
| Physical Vapor Deposition (prior art practice) | 1 to about 40 |
| Physical Vapor Deposition (subject invention) | above about 75 |
| ZrN | |

TABLE I-continued

| Process | Ratio of I(111)/I(200) |
| --- | --- |
| Powder | 1.00 |
| Physical Vapor Deposition (prior art practice) | 1 to about 10 |
| Physical Vapor Deposition (subject invention) | above about 15 |

Figure 5:
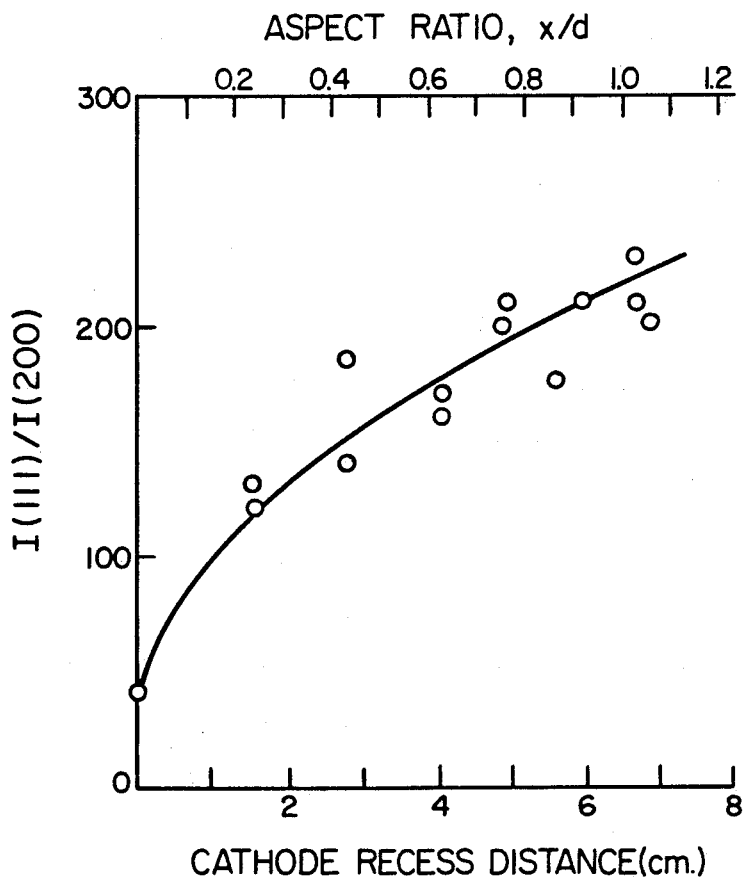
FIG. 5 is a graph illustrating the relationship between the I(111)/I(200) diffraction intensity and the recess distance "x" of a titanium cathode from the open end of the elongated member in the apparatus of FIG. 2 for a 6.35 cm diameter titanium cathode. Also shown is the relationship between the I(111)/I(200) diffraction intensity and the aspect ratio x/d.

The ratio of I(111)/I(200) for TiN and ZrN coatings can be controlled in accordance with the present invention by adjustment of the distance "x" with all other process variables held relatively constant. The relationship between the I(111)/I(200) x-ray diffraction intensity ratio of TiN coatings to the cathode recess distance "x" is shown by the graph of FIG. 5 for a 6.35 cm diameter titanium cathode. These coatings were deposited on ASI 304 stainless steel substrates. A recess distance "x" of 0.5 cm is necessary to provide a diffraction intensity ratio I(111)/I(200) of about 75 assuming all other process variables are adjusted for satisfactory operation in accordance with a prior art physical vapor deposition practice. The bias voltage on the object relative to the anode as −150 Vdc. As the recess distance "x" is increased the intensity ratio I(111)/I(200) increases. Although the I(111)/I(200) ratio of 75 for TiN coatings and of 15 for ZrN coating appear to be the minimum ratios necessary to realize a significant improvement in physical properties in such coatings, a ratio of greater than 100 is preferred for TiN coatings and a ratio of greater than 20 is preferred for ZrN coatings, with optimum properties to be realized when the ratio is above 200 and 50, respectively. The ratio level is readily controllable and has been raised to 2000 or higher for TiN and 90 or higher for ZrN to tailor the properties of the coating for a particular application.

Figure 6:
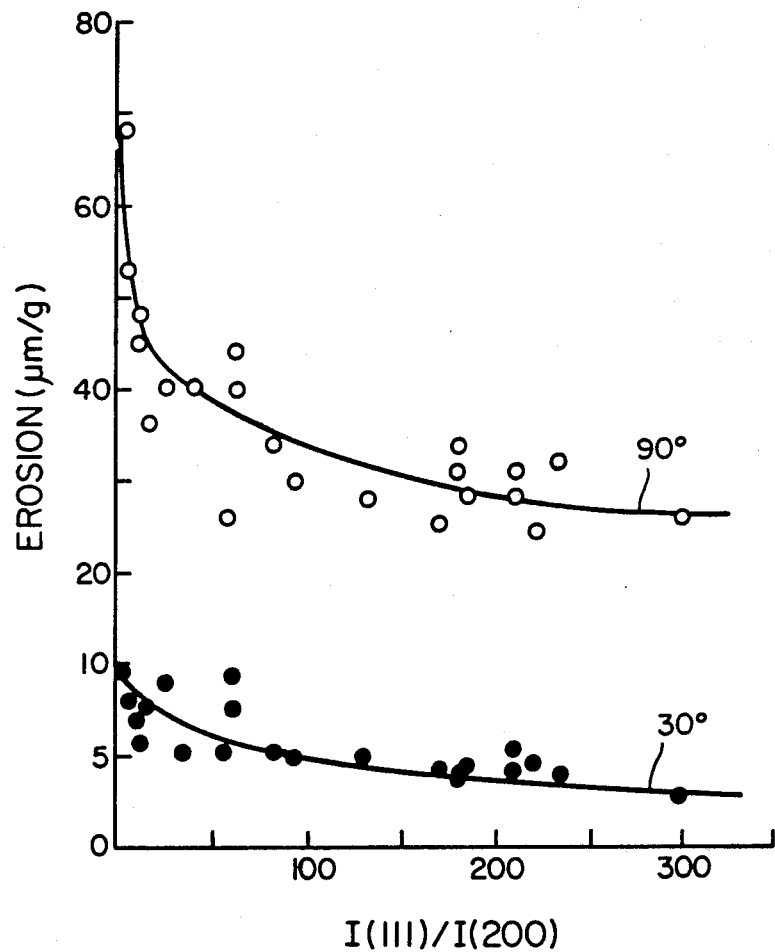
FIG. 6 is a plot of the erosion rate of a titanium nitride coating as a function of variation in the I(111)/I(200) x-ray diffraction intensity ratio.
Figure 7:
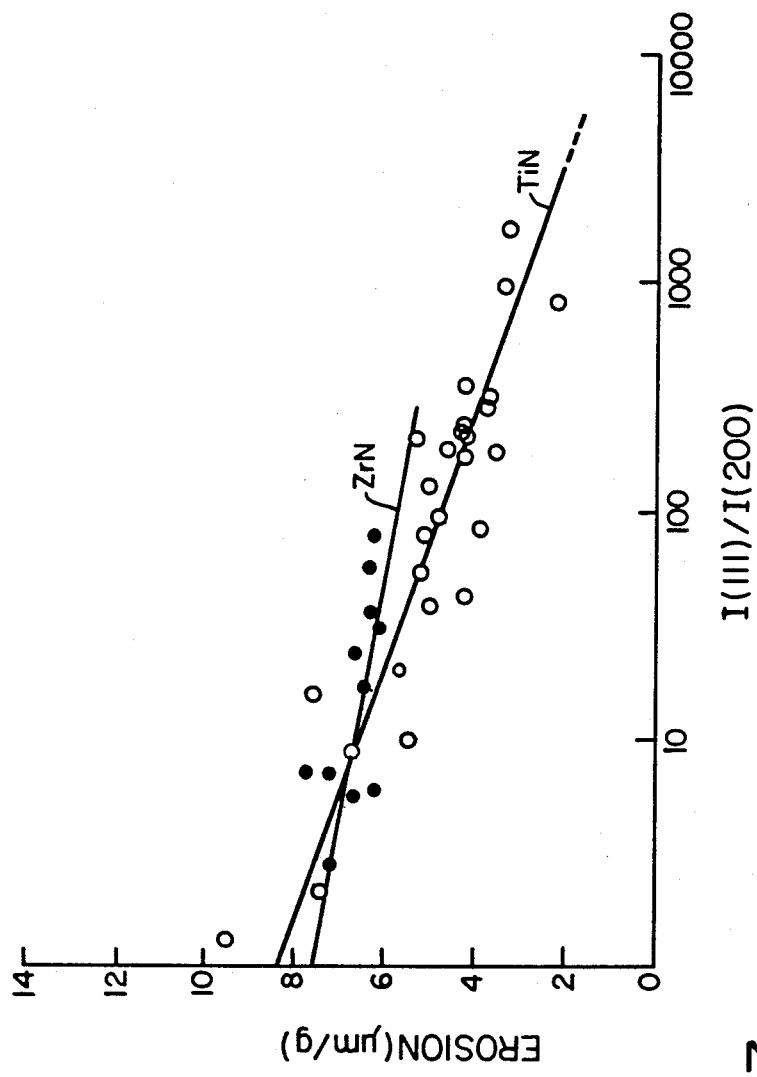
FIG. 7 is a plot of the alumina penetration erosion rate of TiN and ZrN coatings versus log I(111)/I(200) at an alumina impact angle of 30 degrees.
Figure 8:
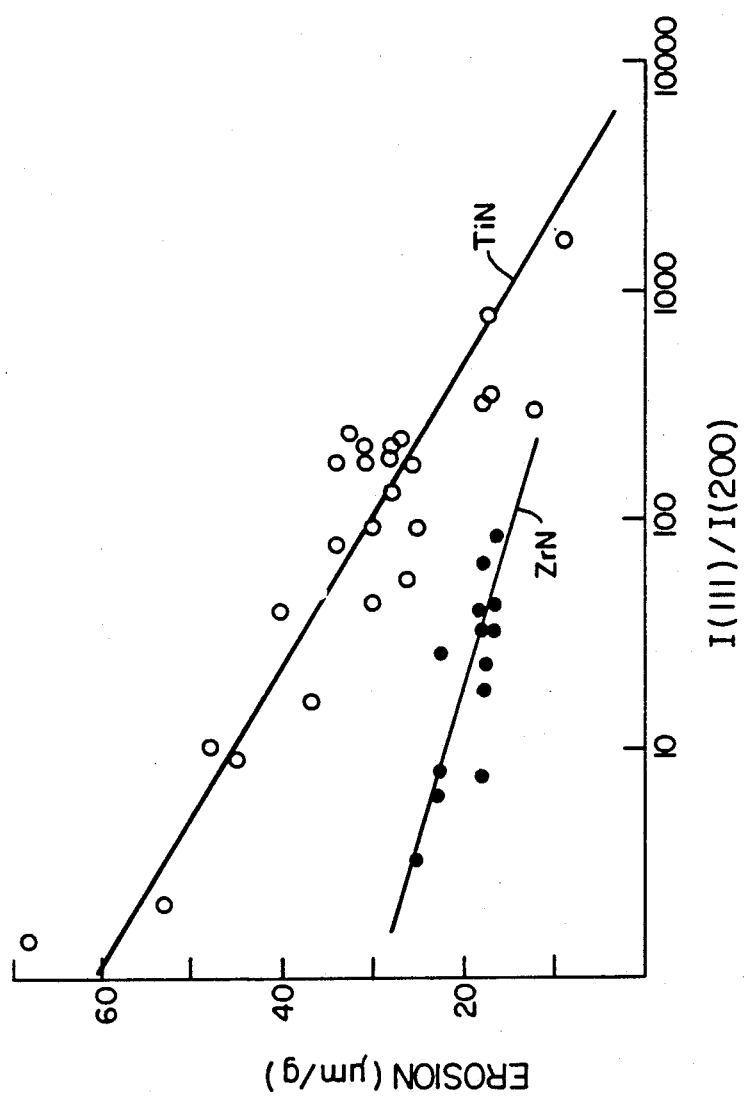
FIG. 8 is a plot of the alumina penetration erosion rate of TiN and ZrN coatings versus log I(111)/I(200) at an alumina impact angle of 90 degrees.

The erosion resistance properties of TiN and ZrN coatings deposited on Ti-6Al-4V blocks vary with the x-ray diffraction intensity ratio I(111)/I(200). The erosion wear resistance of the coatings was determined by impacting the surface with alumina ($Al_2O_3$) particles having a nominal 27 $\mu$m particle size at impact angles of 20 to 90 degrees and at a particle velocity of about 91 meters per second. The erosion rate was measured in terms of the penetration depth in the coating per unit gram of incident alumina particles. FIG. 6 shows that the erosion rate of TiN coatings with 27 $\mu$m angular alumina at both 30 degree and 90 degree impingement angles decreases exponentially with increasing value of I(111)/I(200). This is confirmed for both TiN and ZrN coatings by the plots of the erosion rate vs. log I(111)/I(200) for TiN coatings and ZrN coatings impacted with 27 $\mu$m alumina particles at 30° and 90° as shown in FIGS. 7 and 8, respectively.

Figure 9:
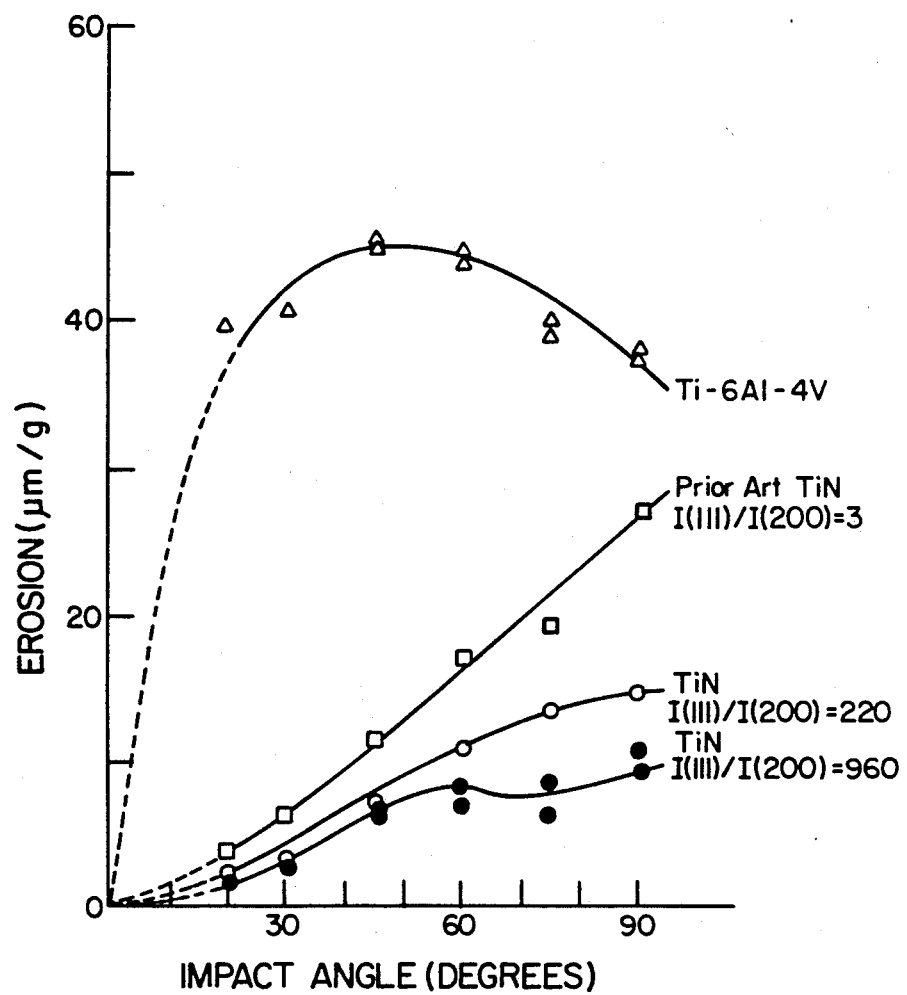
FIG. 9 is a graph comparing the erosion characteristics versus impact angle of alumina onto uncoated Ti-6Al-4V alloy, a prior art arc evaporated TiN coating and two TiN coatings formed in accordance with the present invention.

The effect of impact angle on the erosion rate of Ti-6Al-4V uncoated and coated respectively with a prior art TiN coating and two TiN coatings of this invention, impacted with 27 $\mu$m alumina particles, is shown in FIG. 9. From FIG. 9 it can be readily observed that in addition to an overall reduction in erosion compared to prior art coatings, the improved coating provides a more than proportionate reduction in erosion at the higher impact angles. This unique behavior is particularly desirable for achieving significant high angle erosion resistance improvement for coating materials having ductile erosion behavior such as that shown for the Ti-6Al-4V reference in FIG. 9. TiN and ZrN coatings have been successfully applied on a number of substrate materials such as refractory metals including Ti, Zr, V, Ta, Mo and W, superalloys including Inconel 718, Inconel 738, Waspaloy and A-286, stainless steels including 17-4PH, AISI 304, AISI 316, AISI 403, AISI 422, AISI 410, and AM355, Ti alloys including Ti-6Al-4V and Ti-6Al-2Sn-4Zr-2Mo and Ti-8Al-1Mo-1V, aluminum alloys including 6061 and 7075, WC-Co Cermet, and $Al_2O_3$ ceramics. The above-identified substrates are described in detail in Materials Engineering/Materials Selector '82, published by Penton/IPC, subsidiary of Pittway Corporation, 1111 Chester Ave., Cleveland, Ohio 44114, in 1981, and Alloy Digest, published by Alloy Digest, Inc., Post Office Box 823, Upper Montclair, N.J., in 1980.

Figure 10:
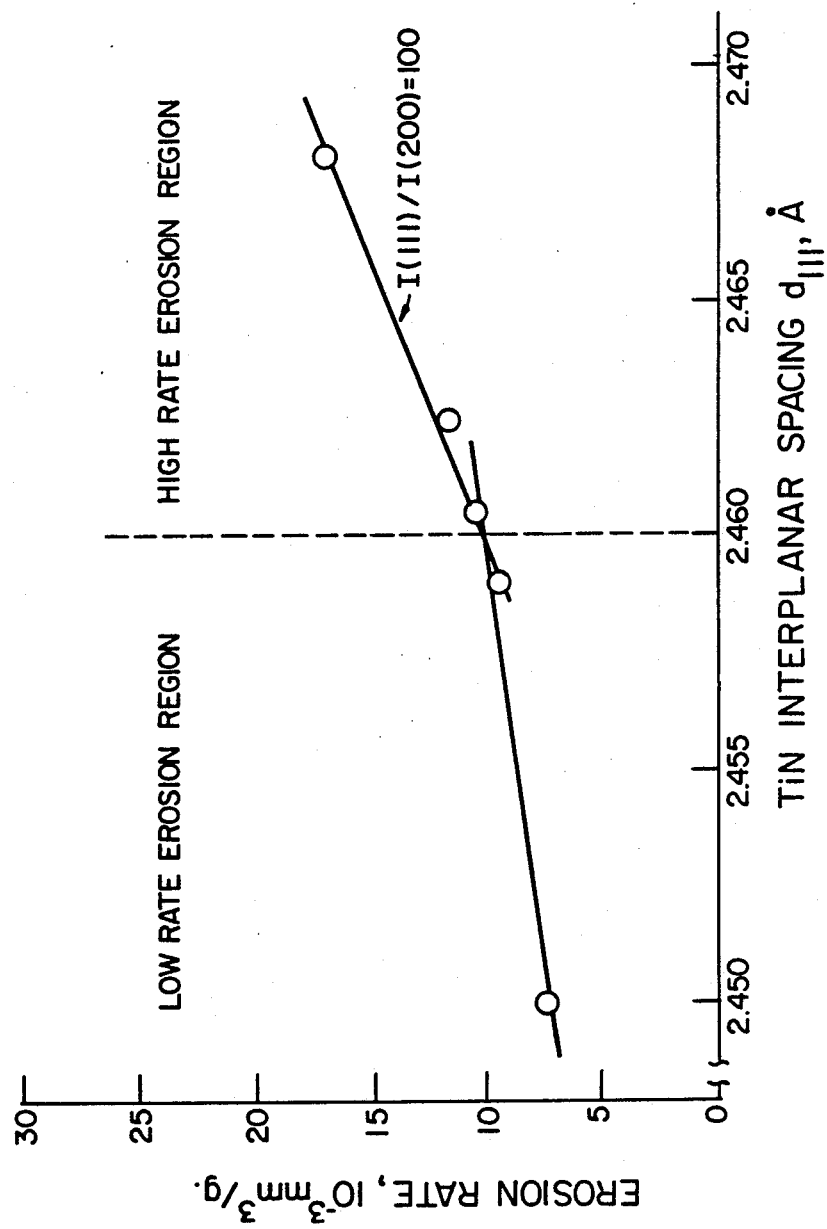
FIG. 10 contains plots of volume erosion rate against $d_{111}$ for a TiN coating having an I(111)/I(200) ratio of 100.

Residual coating stress can be determined from measurement of the interplanar spacing, $d_{111}$. The stress moves toward compression as the $d_{111}$ value increases and toward tension as the $d_{111}$ value decreases relative to the unstressed (i.e. powder) value for the coating. The effect of residual stress as determined by the interplanar spacing, $d_{111}$, on the volume erosion rate for a TiN coating having a fixed I(111)/I(200) ratio of 100 is shown in FIG. 10. The TiN coating on identical substrates was subjected to normal (90°) erosion by impacting angular 50 $\mu$m alumina particles using test apparatus based upon ASTM G76-83 guidelines. This test, hereinafter referred to as the "normal impact 50 $\mu$m alumina test", uses compressed air at 248 KPa to deliver at least a 200 g charge of angular 50 $\mu$m alumina particles through a 5 mm diameter nozzle at a nominal rate of 450 g/min with a nominal velocity of 60 m/s and a nozzle-to-specimen standoff of 10 cm at an impact angle of 90° to the specimen surface.

The volume erosion rate of a coating measures the volume loss of the coating per unit gram, $mm^3/g$, of alumina that impacted the coating in the normal impact 50 $\mu$m alumina test. FIG. 10 shows a discontinuity in the linear slope of the volume erosion rate occurring at the point where $d_{111}$ is about 2.460 Angstroms confirming the low volume erosion rate of TiN coatings having a $d_{111}$ of 2.460 Angstroms or less and a high volume erosion rate for similar TiN coatings having, however, interplanar spacings, $d_{111}$, of more than 2.460 Angstroms. A similar relationship with a discontinuity at about 2.660 Angstroms can be obtained for ZrN coatings.

The SEM photomicrographs of FIGS. 11A and 11B show that an eroded (normal impact 50 $\mu$m alumina test) TiN coating surface having an interplanar spacing, $d_{111}$, of 2.460 Angstroms (FIG. 11A) was much more uniform than the surface of an eroded (normal impact 50 $\mu$m alumina test) TiN coating surface having a $d_{111}$ of 2.463 Angstroms (FIG. 11B), the I(111)/I(200) ratio of both TiN coatings being the same, namely, 1700. Many large erosion pits resulting from intracoating spalling are observed in the eroded coating having the 2.463 Angstrom $d_{111}$, but are absent in the eroded coating having the 2.460 Angstrom $d_{111}$. TiN coatings having interplanar spacings, $d_{111}$, of about 2.460 Angstroms or less are more resistant to brittle fracture and erode uniformly without the large scale intracoating spalling characterizing those having interplanar spacings, $d_{111}$, of more than about 2.460 Angstroms. Similarly, ZrN coatings having interplanar spacings, $d_{111}$, of 2.660 Angstroms or less erode uniformly in the normal impact 50 $\mu$m alumina test without the large scale intracoating spalling that occurs in ZrN coatings having a $d_{111}$ above 2.660 Angstroms.

The interplanar spacing, $d_{111}$, of TiN and ZrN coatings of this invention is a measure of the compressive stress level in the coatings, an increase in $d_{111}$ representing an increase in compressive stress in the coating. The compressive stress level in the coating is inversely related to the volume erosion resistance at normal impact, the higher the compressive stress the lower the volume erosion resistance. In the deposition of TiN or ZrN coatings pursuant to this invention, the process-induced residual stresses are comprised of intrinsic stress due to structure properties and thermal stress resulting from the differences in thermal expansion coefficients of the TiN or ZrN coating and the substrate. The residual compressive stress, as measured by $d_{111}$, can be controlled by the appropriate selection of substrate materials, where possible, and/or by the adjustment of one or more of the deposition parameters, such as, by the adjustment of the distance "x" of the cathode recess, or chamber 37, by the adjustment of the deposition rate, i.e., the rate at which TiN or ZrN deposits on the substrate, for example, by adjustment of the evaporator current applied to the cathode, and/or by adjustment of the spatial standoff of the substrate. The intrinsic stress is believed due primarily to the presence of nitrogen interstitials in the case of TiN crystals and can be reduced by increasing the rate of deposition of the TiN crystals. The density of metal species (Ti and Ti+, or Zr and Zr+) in the chamber 11 is greater nearer to the cathode while the gas species (N and N+) are more uniformly dispersed throughout the chamber 11. Typically, higher stress coatings result at greater spatial standoffs. The deposition rate, of course, is inversely proportional to the spatial standoff. Furthermore, the deposition rate increases and therefore the interplanar space, $d_{111}$, decreases as the distance "x" of the cathode recess decreases.

A number of different substrates were coated with TiN or ZrN, namely, Mo, W, Zr, Nb, Ti, Ti-6Al-4V, 410 SS (stainless steel), Ni, Inconel 718, and AISI 304 pursuant to this invention. It was found that interplanar spacing, $d_{111}$, decreases with decreasing thermal expansion coefficient of the substrate. The selection of deposition temperatures of TiN and ZrN coatings compatible with the thermal expansion coefficient of the substrate material also is important in order to produce a coating having the minimum compressive stress, $d_{111}$.

Figure 12:
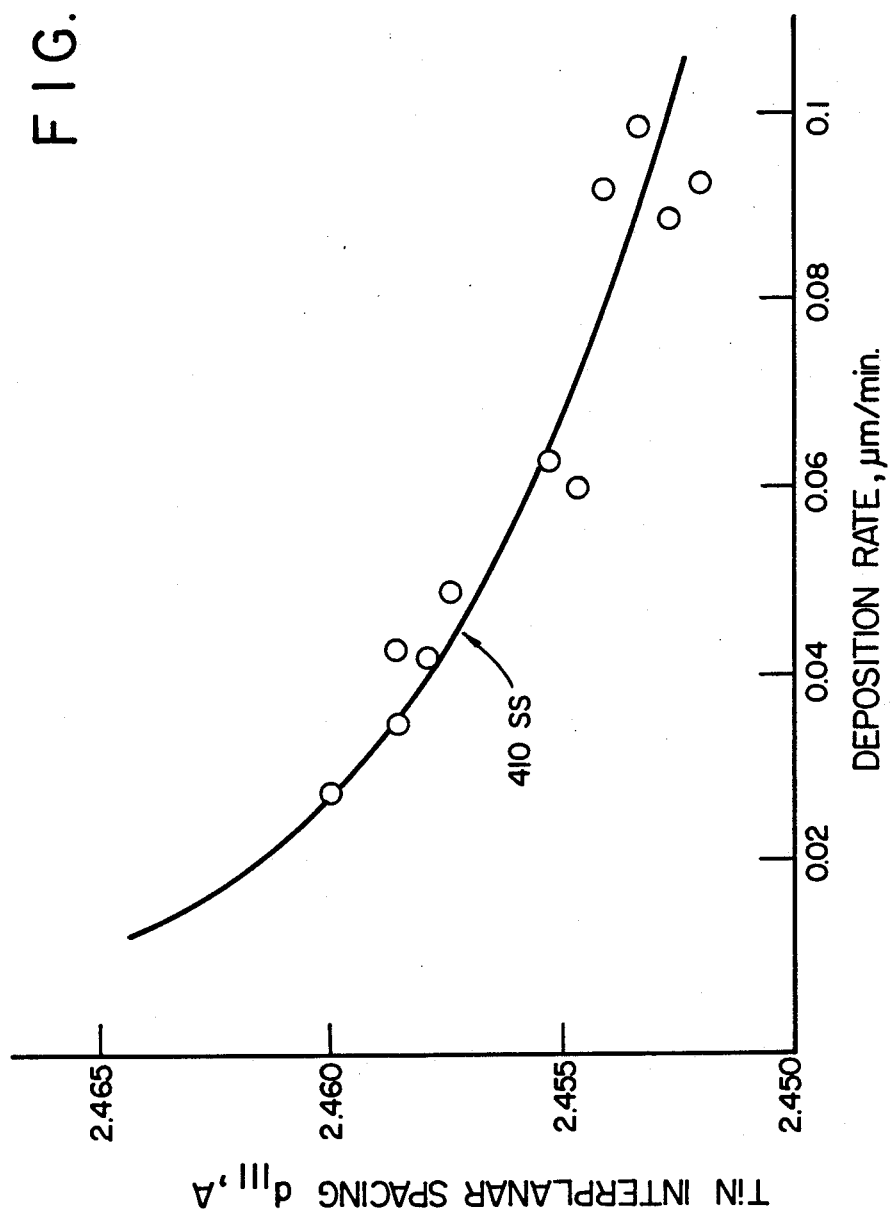
FIG. 12 is a plot of deposition rate of a TiN coating on a 410 SS substrate vs. the $d_{111}$ of the TiN coating.

In FIG. 12, the interplanar spacing, $d_{111}$, of TiN coatings deposited on a stainless steel, AISI 410, substrates is plotted against the deposition rate of the TiN onto the substrates. FIG. 12 shows that $d_{111}$ decreases exponentially as the deposition rate increases and illustrates the approximate minimum deposition rate for producing TiN coatings with $d_{111}$ values of 2.460 or less.

EXAMPLES 1 and 2

Examples 1 and 2 further illustrate the invention and are carried out in the apparatus shown in FIG. 2 using the materials and process parameters given in Table II below to produce TiN and ZrN coated substrates, respectively, having the I(111)/I(200) intensity ratios, the interplanar spacing values, $d_{111}$, and 90° volume erosion rate (normal impact 50 μm alumina test) given below for each of Examples 1 and 2.

TABLE II

|  | Example 1 | Example 2 |
|---|---|---|
| Coating Composition | TiN | ZrN |
| I(111)/I(200) | 175 | 55 |
| $d_{(111)}$ | 2.455 Angstroms | 2.656 Angstroms |
| 90° Volume Erosion Rate | $8.5 \times 10^{-3}$ mm$^3$/g | $5.7 \times 10^{-4}$ mm$^3$/g |
| Substrate | 410SS | IN718 |
| Cathode Composition | Ti | Zr |
| Cathode (Cylindrical) Diameter | 6.35 cm | 6.35 cm |
| Dimension "x" | 3.8 cm | 2.6 cm |
| Spatial Standoff | 39 cm | 30 cm |
| Chamber Pressure | 0.018 torr | 0.042 torr |
| N$_2$ Gas Flow | 340 sccm | 215 sccm |
| Arc Current | 125 Adc | 139 Adc |
| Substrate Bias | 150 Vdc | 250 Vdc |
| Deposition Rate | 0.065 μm/min | 0.092 μm/min |
| Substrate Temp. | 480° C. | 670° C. |

What we claim is:

1. A polycrystalline zirconium nitride coating composition having a highly oriented crystallographic structure consisting of an I(111)/I(200) x-ray diffraction intensity ratio of at least about 15.

2. A zirconium nitride polycrystalline coating composition as defined in claim 1 having an I(111)/I(200) x-ray diffraction intensity ratio greater than 50.

3. A ZrN polycrystalline coating composition as defined in claim 1 having an x-ray diffraction interplanar spacing, $d_{111}$, of 2.660 Angstroms or less.

4. A polycrystalline titanium nitride coating composition having a highly oriented crystallographic structure consisting of an I(111)/I(200) x-ray diffraction intensity ratio of at least about 75.

5. A titanium nitride polycrystalline coating composition as defined in claim 4 having an I(111)/I(200) x-ray diffraction intensity ratio greater than 100.

6. A TiN polycrystalline coating composition as defined in claim 4 having an x-ray diffraction interplanar spacing, $d_{111}$, of 2.460 Angstroms or less.

7. A zirconium nitride coated article having highly erosion resistant characteristics comprising a substrate and a coating of a polycrystalline zirconium nitride coating composition having a highly oriented crystallographic structure with an I(111)/I(200) x-ray diffraction intensity ratio of at least about 15.

8. A ZrN coated article as defined in claim 7 wherein said ZrN coating has an x-ray diffraction interplanar spacing, $d_{111}$, of 2.660 Angstroms or less.

9. A TiN coated article having highly erosion resistant characteristics comprising a substrate and a coating of a polycrystalline titanium nitride coating composition having a highly oriented crystallographic structure with an I(111)/I(200) x-ray diffraction intensity ratio of at least about 75.

10. A TiN or ZrN coated article as defined in claim 7 wherein said substrate is composed of either a refractory metal, refractory alloy, aluminum alloy, superalloy, stainless steel, or ceramic composites.

11. A TiN or ZrN coated article as defined in claim 10 wherein said refractory metal is selected from the class consisting of Ti, Zr, V, Ta, Cr, Mo and W.

12. A TiN or ZrN coated article as defined in claim 10 wherein said superalloy is selected from the class consisting of Inconel 718, Inconel 738, A-286 and Waspaloy.

13. A TiN or ZrN coated article as defined in claim 10 wherein said stainless steel is selected from the class consisting of 17-4PH, AISI 304, AISI 316, AISI 403, AISI 422, AISI 410 and AM 355.

14. A TiN or ZrN coated article as defined in claim 10 wherein the substrates are Ti-6Al-4V, Ti-8Al-1Mo-1Va and Ti-6Al-2Sn-4Zr-2Mo.

15. A TiN coated article as defined in claim 9 wherein said TiN coating has an x-ray diffraction interplanar spacing, $d_{111}$, of 2.460 Angstroms or less.

16. A method of forming a highly oriented polycrystalline titanium nitride or zirconium nitride coating upon a substrate with the TiN or ZrN coating having a high I(111)/I(200) x-ray diffraction intensity ratio comprising the steps of:
   (a) providing within a vacuum chamber cathode comprising a source material of titanium or zirconium upon an evaporable end surface, and an anode spaced apart from the cathode;
   (b) generating an electric arc between the evaporable end surface of the cathode and the anode to form a plasma of material from the source material;
   (c) surrounding the cathode with an elongated member positioned between and spaced from the cathode and the anode, wherein the elongated member is electrically insulated from the cathode and the anode and has an open end extending a distance x beyond the evaporable end surface of the cathode to form a cathode chamber containing the plasma;
   (d) directing a flow of nitrogen gas through the plasma in the cathode chamber and into the vacuum chamber such that the gas envelops the electric arc over at least the distance x before entering the vacuum chamber;
   (e) withdrawing gas from the vacuum chamber to maintain a predetermined pressure within the vacuum chamber; and
   (f) depositing a coating of material from the plasma upon the object.

17. A method as defined in claim 16 wherein the I(111)/I(200) x-ray diffraction intensity ratio is at least about 75.

18. A method as defined in claim 16 wherein step (c) the cathode is surrounded with the elongated member to form a space between the cathode and the elongated member and the nitrogen gas is introduced into the space.

19. A method as defined in claim 16 wherein the elongated member has a circular cross-section and surrounds the cathode which has a circular cross-section, to form the space having an annular cross-section.

20. A method as defined in claim 16 wherein d is the major dimension of the cathode evaporable end surface, and the cathode is surrounded by the elongated member in step (b) such that the open end of the elongated member extends beyond the evaporable end surface of the cathode such that x/d is from 0.07 to 2.

21. A method as defined in claim 20 wherein x/d is between 0.3 and 1.0.

22. A method as defined in claim 16 wherein the vacuum chamber is evacuated to a pressure of between $10^{-1}$ and $5\times10^{-4}$ torr.

23. A method as defined in claim 16 wherein the electrical potential of the substrate is more negative than the anode.

24. A method as defined in claim 16 wherein the electrical potential of the substrate is more negative than the anode and the cathode.

25. A method as defined in claim 16 wherein material from the source material is deposited on said elongated member to form a converging nozzle having a nozzle aperture greater than zero and less than 0.4 cm.

26. A method as defined in claim 16 wherein the object is composed of a material selected from the class consisting of refractory metals, refractory alloys, superalloys, aluminum alloys, stainless steels, and ceramic composites.

27. A method as defined in claim 16 wherein said coating is a highly oriented polycrystalline titanium nitride having an interplanar spacing, $d_{111}$, of 2.460 Angstroms or less.

28. A method as defined in claim 16 wherein said coating is a highly oriented zirconium nitride having an interplanar spacing $d_{111}$, or 2.660 Angstroms or less.

29. A method as defined in claim 16 wherein said coating is a highly oriented zirconium nitride having an I(111)/I(200) x-ray diffraction intensity ratio of at least 15.

* * * * *

UNITED STATES PATENT AND TRADEMARK OFFICE
CERTIFICATE OF CORRECTION

PATENT NO. : 4,895,765

DATED : Jan. 23, 1990

INVENTOR(S) : Jiinjen A. Sue, Harden H. Troue

It is certified that error appears in the above-identified patent and that said Letters Patent is hereby corrected as shown below:

Column 2, line 9, delete "(111)I(200)" and substitute therefor --(111)/I(200)--.

Column 2, line 20, delete "(1111)/I(200)" and substitute therefor --(111)/I(200)--.

Column 2, line 27, after the word "resistance" insert --which is substantially greater than the erosion resistance--.

Column 3, line 18, delete I(111)I(200) and substitute therefor --I(111)/I(200)--.

Column 4, line 57, delete "reflect ion" and substitute therefor --reflection--.

Column 7, line 16, delete "19" and substitute therefor --18--.

Column 8, line 6, after the word "serves" insert --as--.

Column 8, line 18, delete "floWs" and substitute therefor --flows--.

Column 9, line 18, delete "ASI" and substitute therefor --AISI--.

Column 9, line 30, after the word "for" insert --both--.

Column 11, line 2, after the word "Angstroms" insert --eroded--.

Column 11, line 45, delete "With" and substitute therefor --with--.

UNITED STATES PATENT AND TRADEMARK OFFICE
CERTIFICATE OF CORRECTION

PATENT NO. : 4,895,765

DATED : Jan. 23, 1990

INVENTOR(S) : Jiinjen A. Sue, Harden H. Troue

It is certified that error appears in the above-identified patent and that said Letters Patent is hereby corrected as shown below:

Column 12, line 7, delete "$10^{-4} mm^3/g$" and substitute therefor --$10^{-3} mm^3/g$--.

Signed and Sealed this

Seventh Day of April, 1992

Attest:

HARRY F. MANBECK, JR.

*Attesting Officer*　　　　*Commissioner of Patents and Trademarks*